United States Patent
Nozawa et al.

(10) Patent No.: US 9,436,079 B2
(45) Date of Patent: Sep. 6, 2016

(54) PHASE SHIFT MASK BLANK, METHOD OF MANUFACTURING THE SAME, AND PHASE SHIFT MASK

(71) Applicant: HOYA CORPORATION, Tokyo (JP)

(72) Inventors: Osamu Nozawa, Tokyo (JP); Hiroaki Shishido, Tokyo (JP); Kazuya Sakai, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 85 days.

(21) Appl. No.: 14/627,426

(22) Filed: Feb. 20, 2015

(65) Prior Publication Data

US 2015/0168823 A1 Jun. 18, 2015

Related U.S. Application Data

(62) Division of application No. 13/639,686, filed as application No. PCT/JP2011/002090 on Apr. 8, 2011, now Pat. No. 8,999,609.

(30) Foreign Application Priority Data

Apr. 9, 2010 (JP) .................................. 2010-090435

(51) Int. Cl.
*G03F 1/32* (2012.01)
*C23C 14/00* (2006.01)
(Continued)

(52) U.S. Cl.
CPC .............. *G03F 1/32* (2013.01); *C23C 14/0036* (2013.01); *C23C 14/0641* (2013.01); *G03F 1/26* (2013.01); *G03F 1/54* (2013.01); *G03F 7/2041* (2013.01); *B82Y 30/00* (2013.01); *Y10S 977/755* (2013.01)

(58) Field of Classification Search
CPC ....... G03F 1/32; G03F 1/54; C23C 14/0036; C23C 14/0641
USPC ............................................................. 430/5
See application file for complete search history.

(56) References Cited

U.S. PATENT DOCUMENTS

| 2002/0058186 A1 | 5/2002 | Nozawa et al. |
| 2002/0122991 A1 | 9/2002 | Shiota et al. |

(Continued)

FOREIGN PATENT DOCUMENTS

| CN | 1756996 A | 4/2006 |
| JP | 10-069064 A | 3/1998 |

(Continued)

OTHER PUBLICATIONS

International Search Report of PCT/JP2011/002090 dated May 24, 2011.

(Continued)

*Primary Examiner* — Stephen Rosasco
(74) *Attorney, Agent, or Firm* — Sughrue Mion, PLLC

(57) ABSTRACT

Provided are a phase shift mask blank that is improved in the irradiation durability of a light-semitransmissive film (phase shift film), made of a material containing mainly a transition metal, silicon, and nitrogen, to exposure light having a wavelength of 200 nm or less and thus can improve the mask lifetime, a method of manufacturing such a phase shift mask blank, and a phase shift mask. The phase shift mask blank is used for manufacturing a phase shift mask adapted to be applied with ArF excimer laser exposure light. The phase shift mask blank has a light-semitransmissive film on a transparent substrate. The light-semitransmissive film is an incomplete nitride film containing mainly a transition metal, silicon, and nitrogen. The content ratio of the transition metal to the transition metal and the silicon in the light-semitransmissive film is less than 9%.

17 Claims, 8 Drawing Sheets

(51) Int. Cl.
    *C23C 14/06*    (2006.01)
    *G03F 1/54*     (2012.01)
    *G03F 7/20*     (2006.01)
    *G03F 1/26*     (2012.01)
    *B82Y 30/00*    (2011.01)

(56) References Cited

U.S. PATENT DOCUMENTS

2002/0182893 A1   12/2002   Ballantine et al.
2004/0175629 A1    9/2004   Wasson et al.

FOREIGN PATENT DOCUMENTS

| | | |
|---|---|---|
| JP | 10-148929 A | 6/1998 |
| JP | 2002-156742 A | 5/2002 |
| JP | 2002-162726 A | 6/2002 |
| JP | 2002-258455 A | 9/2002 |
| JP | 2003215778 A | 7/2003 |

OTHER PUBLICATIONS

Office Action dated Apr. 18, 2014, issued by the State Intellectual Property Office of the P.R.C. In corresponding Chinese Application No. 201180018078.0.

Office Action issued in corresponding Japanese Patent Application No. 2013-139879 dated Jan. 7, 2015.

PHASE SHIFT MASK BLANK, METHOD OF MANUFACTURING THE SAME, AND PHASE SHIFT MASK

CROSS REFERENCE TO RELATED APPLICATIONS

This is a Divisional of application Ser. No. 13/639,686 filed Nov. 12, 2012, claiming priority based on International Application No. PCT/JP2011/002090 filed Apr. 8, 2011, claiming priority based on Japanese Patent Application No. 2010-090435 filed Apr. 9, 2010, the contents of all of which are incorporated herein by reference in their entirety.

TECHNICAL FIELD

This invention relates to a mask blank improved in irradiation durability, to a method of manufacturing the same, and to a phase shift mask. In particular, this invention relates to a phase shift mask blank for use in the manufacture of a phase shift mask to be suitably used in an exposure apparatus using exposure light having a short wavelength of 200 nm or less as an exposure light source, to a method of manufacturing such a phase shift mask blank, and to such a phase shift mask.

BACKGROUND ART

Generally, fine pattern formation is carried out by the photolithography in manufacturing processes of a semiconductor device. A number of substrates called transfer masks are normally used for this fine pattern formation. The transfer mask comprises generally a transparent glass substrate having thereon a fine pattern made of a metal thin film or the like. The photolithography is used also in the manufacture of the transfer mask.

In the manufacture of a transfer mask by the photolithography, use is made of a mask blank having a thin film (e.g. light-shielding film or the like) for forming a transfer pattern (mask pattern) on a transparent substrate such as a glass substrate. The manufacture of the transfer mask using the mask blank comprises an exposure process of applying required pattern writing to a resist film formed on the mask blank, a developing process of developing the resist film according to the required pattern writing to form a resist pattern, an etching process of etching the thin film according to the resist pattern, and a process of stripping and removing the remaining resist pattern. In the developing process, a developer is supplied after applying the required pattern writing to the resist film formed on the mask blank to dissolve a portion of the resist film soluble in the developer, thereby forming the resist pattern. In the etching process, using this resist pattern as a mask, an exposed portion of the thin film, where the resist pattern is not formed, is dissolved by dry etching or wet etching, thereby forming a required mask pattern on the transparent substrate. In this manner, the transfer mask is produced.

For miniaturization of a pattern of a semiconductor device, it is necessary to shorten the wavelength of an exposure light source for use in the photolithography in addition to the miniaturization of the mask pattern formed in the transfer mask. In recent years, the wavelength of an exposure light source in the manufacture of a semiconductor device has been shortened from KrF excimer laser (wavelength 248 nm) to ArF excimer laser (wavelength 193 nm).

As a type of transfer mask, a halftone phase shift mask is known apart from a conventional binary mask having a light-shielding film pattern made of a chromium-based material on a transparent substrate. This halftone phase shift mask is configured to have a phase shift film in the form of a light-semitransmissive film on a transparent substrate. This phase shift film in the form of the light-semitransmissive film is adapted to transmit light having an intensity that does not substantially contribute to exposure (e.g. 1% to 20% at an exposure wavelength) and to provide a predetermined phase difference. By means of phase shift portions formed by patterning the phase shift film and light-transmissive portions formed with no phase shift film and adapted to transmit light having an intensity that substantially contributes to exposure, the halftone phase shift mask provides a relationship in which the phase of the light transmitted through the phase shift portions is substantially inverted with respect to the phase of the light transmitted through the light-transmissive portions. As a consequence, the lights having passed near the boundaries between the phase shift portions and the light-transmissive portions and bent into the others' regions due to the diffraction phenomenon cancel each other out. This makes the light intensity at the boundaries approximately zero to thereby improve the contrast, i.e. the resolution, at the boundaries. As a material of this phase shift film, use is widely made of a molybdenum silicide compound being a material containing molybdenum and silicon.

Patent Document 1: JP-A-2002-156742
Patent Document 2: JP-A-2002-258455

DISCLOSURE OF THE INVENTION

Problem to be Solved by the Invention

Following the reduction in exposure light source wavelength in recent years, however, mask degradation due to repeated use of a transfer mask has become notable. Particularly in the case of a phase shift mask, a phenomenon occurs in which the transmittance and the phase difference change and further the line width also changes (increases) due to irradiation of ArF excimer laser (wavelength 193 nm) as an exposure light source. In the case of the phase shift mask, such changes in transmittance and phase difference are serious problems that affect the mask performance. If the change in transmittance becomes large, the transfer accuracy is degraded, while if the change in phase difference becomes large, the phase shift effect at the pattern boundaries is difficult to obtain so that the contrast at the pattern boundaries is lowered and thus the resolution is significantly reduced. Further, the change in line width degrades the CD accuracy of the phase shift mask and finally degrades the CD accuracy of a pattern-transferred wafer.

According to the study of the present inventors, the background of the problem of the mask degradation due to the repeated use of the transfer mask is assumed as follows. Conventionally, for example, when haze is generated, cleaning is carried out for removing the haze, but a film loss (dissolution) due to the cleaning cannot be avoided and thus, roughly, the number of times of cleaning determines the mask lifetime. However, since the number of times of cleaning is reduced due to an improvement to haze in recent years, the period of time of the repeated use of a mask is prolonged and thus the exposure time is prolonged correspondingly, and therefore, a problem of the irradiation durability particularly to short-wavelength light such as ArF excimer laser has been newly actualized.

Further, since the transfer mask manufacturing cost has been increasing following the pattern miniaturization, there is an increasing need for a longer lifetime of a transfer mask and thus a further improvement is required also for chemical resistance and hot water resistance of the transfer mask.

Also conventionally, in order to suppress changes in transmittance and phase difference of a phase shift film due to exposure light irradiation, for example, a phase shift film composed mainly of a metal and silicon is heat-treated in the atmosphere or an oxygen atmosphere at 250 to 350° C. for 90 to 150 minutes (e.g. Patent Document 1 referred to above) or a cap layer composed mainly of a metal and silicon is formed on a phase shift film composed mainly of a metal and silicon (e.g. Patent Document 2 referred to above). However, a further improvement in the irradiation durability of a film to exposure light is required in the course of the reduction in exposure light source wavelength in recent years.

Therefore, this invention has been made for solving the conventional problems and has an object to provide a phase shift mask blank that is improved in the irradiation durability of a light-semitransmissive film, made of a material composed mainly of a transition metal, silicon, and nitrogen, to exposure light having a wavelength of 200 nm or less and thus can improve the mask lifetime, a method of manufacturing the same, and a phase shift mask.

Means for Solving the Problem

The present inventors have assumed a cause of the degradation of the transfer mask due to its repeated use becoming notable following the reduction in exposure light source wavelength, as follows. As will be described in Examples, it has been elucidated from the results of tests based on diligent efforts of the present inventors that the effect of this invention is exhibited with a predetermined structure of this invention, and therefore, this invention is not restricted to an assumption described below.

As a result of examining a halftone phase shift film pattern of a halftone phase shift mask, made of a MoSi-based material and subjected to changes in transmittance and phase difference due to its repeated use, the present inventors have found that a modified layer containing Si, O, and a little Mo is formed on the surface layer side of the MoSi-based film and that this is one of main causes of the changes in transmittance and phase difference and a change (increase) in line width. The reason (mechanism) for the formation of such a modified layer is considered as follows. That is, the conventional sputtered MoSi-based film (phase shift film) structurally has gaps and, even if annealing is carried out after the film formation, the change in the structure of the MoSi film is small, and therefore, for example, oxygen ($O_2$) and water ($H_2O$) in the atmosphere and, further, ozone ($O_3$) and the like produced by reaction of oxygen ($O_2$) with ArF excimer laser enter the gaps and react with Si and Mo forming the phase shift film in the course of using the phase shift mask. That is, when Si and Mo forming the phase shift film are subjected to irradiation of exposure light (particularly short-wavelength light such as ArF) in such an environment, they are excited into a transition state so that Si is oxidized and expanded (because $SiO_2$ is larger in volume than Si) and Mo is also oxidized, thereby forming a modified layer on the surface layer side of the phase shift film. Then, when cumulatively irradiated with the exposure light due to repeated use of the phase shift mask, oxidation and expansion of Si further proceed and oxidized Mo diffuses in the modified layer to be deposited on a surface thereof and sublimated as, for example, $MoO_3$. As a result, it is considered that the thickness of the modified layer gradually increases (the occupation ratio of the modified layer in the MoSi film increases). This phenomenon of the formation and enlargement of the modified layer is significantly observed in the case of short-wavelength exposure light such as ArF excimer laser having energy necessary for exciting Si and Mo, i.e. the constituent atoms, of the phase shift film into a transition state, which triggers oxidation reactions of those atoms. Such a phenomenon is not limited to the MoSi-based material, but also applies to a phase shift film made of a material containing another transition metal and silicon.

Based on the elucidated fact and consideration described above, the present inventors have further continued intensive studies. As a result, the present inventors have found that if a light-semitransmissive film is an incomplete nitride film containing a transition metal (M) less than 9% with respect to the transition metal (M) and silicon, M-N bonds contained in the film can be relatively reduced as compared with a case of a complete nitride film containing less than 9% transition metal (M), or the like, that this makes it possible to prevent the transition metal from being oxidized and deposited on a surface layer of the light-semitransmissive film, and specifically, that, surprisingly, it is possible to suppress a change in film thickness based on formation of a modified layer to zero, thereby significantly improving the irradiation durability, and have completed this invention.

This invention has the following structures.

(Structure 1)

A phase shift mask blank for manufacturing a phase shift mask adapted to be applied with ArF excimer laser exposure light, comprising:

a transparent substrate; and a light-semitransmissive film on the transparent substrate;

wherein the light-semitransmissive film is an incomplete nitride film containing mainly a transition metal, silicon, and nitrogen, and a content ratio of the transition metal to the transition metal and the silicon in the light-semitransmissive film is less than 9%.

(Structure 2)

The phase shift mask blank according to structure 1, wherein the content ratio of the transition metal to the transition metal and the silicon in the light-semitransmissive film is 2% or more.

(Structure 3)

The phase shift mask blank according to structure 1 or 2, wherein the incomplete nitride film contains Mo—N bonds and Mo—Si bonds, and a content of the Mo—Si bonds is relatively greater than a content of the Mo—N bonds.

(Structure 4)

The phase shift mask blank according to any of structures 1 to 3, wherein the incomplete nitride film mainly contains Si—N bonds and Mo—Si bonds.

(Structure 5)

The phase shift mask blank according to any of structures 1 to 3, wherein the light-semitransmissive film has a transmittance of 4% or more and less than 9% with respect to a wavelength of the exposure light.

(Structure 6)

The phase shift mask blank according to any of structures 1 to 5, wherein a content of the nitrogen in the light-semitransmissive film is 40 at % or more and 47 at % or less.

(Structure 7)

The phase shift mask blank according to any of structures 1 to 6, wherein the transition metal is molybdenum.

(Structure 8)

The phase shift mask blank according to any of structures 1 to 7, wherein the light-semitransmissive film has a thickness of 75 nm or less.

(Structure 9)

A phase shift mask adapted to be applied with ArF excimer laser exposure light, comprising:
a transparent substrate; and
a light-semitransmissive film pattern on the transparent substrate;
wherein the light-semitransmissive film pattern is made of an incomplete nitride film containing mainly a transition metal, silicon, and nitrogen, and
a content ratio of the transition metal to the transition metal and the silicon in the light-semitransmissive film pattern is less than 9%.

(Structure 10)

The phase shift mask according to structure 9, wherein the content ratio of the transition metal to the transition metal and the silicon in the light-semitransmissive film pattern is 2% or more.

(Structure 11)

The phase shift mask according to structure 9 or 10, wherein the incomplete nitride film contains Mo—N bonds and Mo—Si bonds, and a content of the Mo—Si bonds is relatively greater than a content of the Mo—N bonds.

(Structure 12)

The phase shift mask according to any of structures 9 to 11, wherein the incomplete nitride film mainly contains Si—N bonds and Mo—Si bonds.

(Structure 13)

The phase shift mask according to any of structures 9 to 12, wherein a content of the nitrogen in the light-semitransmissive film pattern is 40 at % or more and 47 at % or less.

(Structure 14)

The phase shift mask according to any of structures 9 to 13, wherein the transition metal is molybdenum.

(Structure 15)

The phase shift mask according to any of structures 9 to 14, wherein the light-semitransmissive film pattern has a thickness of 75 nm or less.

(Structure 16)

A method of manufacturing a phase shift mask blank, the phase shift mask blank being used for manufacturing a phase shift mask adapted to be applied with ArF excimer laser exposure light, comprising:
a step of carrying out sputtering in an atmosphere containing a nitrogen gas to thereby form on a transparent substrate a light-semitransmissive film containing mainly a transition metal, silicon, and nitrogen,
wherein a flow rate of the nitrogen gas in the atmosphere is less than a flow rate for completely nitriding the transition metal and the silicon.

(Structure 17)

The method of manufacturing a phase shift mask blank according to structure 16, wherein the flow rate of the nitrogen gas in the atmosphere is more than 70% and less than 95% with respect to the flow rate for completely nitriding the transition metal and the silicon.

(Structure 18)

A method of manufacturing a semiconductor device, comprising: forming a circuit pattern on a semiconductor wafer using a transfer mask manufactured by using the phase shift mask blank according to structure 1.

(Structure 19)

A method of manufacturing a semiconductor device, comprising: forming a circuit pattern on a semiconductor wafer using the phase shift mask according to structure 9.

Hereinbelow, this invention will be described in detail.

As described in structure 1, this invention provides a phase shift mask blank for manufacturing a phase shift mask adapted to be applied with ArF excimer laser exposure light, comprising:
a transparent substrate; and
a light-semitransmissive film on the transparent substrate;
wherein the light-semitransmissive film is an incomplete nitride film containing mainly a transition metal, silicon, and nitrogen, and
a content ratio of the transition metal to the transition metal and the silicon in the light-semitransmissive film is less than 9%.

In this invention, an incomplete nitride is a compound in which the nitrogen content is less than that of a stoichiometric composition corresponding to a possible valence of a transition metal element or a silicon element. That is, it is a state where M-N bonds and Si—N bonds are small in amount.

In this invention, it can be said that an incomplete nitride is a compound in a state where M-N bonds and Si—N bonds are smaller in amount as compared with a complete nitride.

For example, when forming a light-semitransmissive film composed mainly of a transition metal, silicon, and nitrogen on a transparent substrate by sputtering in an atmosphere containing nitrogen, the nitrogen content in the film increases (transmittance increases) as the flow rate of a nitrogen gas increases. However, the increase amount of the transmittance relative to the increase amount of the flow rate of the nitrogen gas gradually decreases and then a state is reached where the nitrogen content in the film does not increase (transmittance does not increase) even if the flow rate of the nitrogen gas increases. In this invention, this state is called a complete nitride. On the other hand, a state before reaching this complete nitride state, i.e. the state where there still remains room for an increase in nitrogen content in the film (the state where there still remains room for an increase in transmittance) even when the flow rate of the nitrogen gas increases, is called an incomplete nitride. The incomplete nitride is included in the state where the increase in transmittance relative to the increase in the flow rate of the nitrogen gas gradually decreases. The incomplete nitride does not include the state before the state where the increase in transmittance relative to the increase in the flow rate of the nitrogen gas gradually decreases.

For example, when the transition metal is molybdenum, bonding states with respect to the nitrogen gas flow rates are as follows.

Specifically, when the nitrogen flow rate is zero (0 sccm) (in the case of a MoSi film), main bonding states in the film are Si—Si bonds and Mo—Si bonds as shown in FIG. 5. Since the Si—Si bonds are contained much, it is considered that influence on the irradiation durability occurs due to Si oxidation.

When the nitrogen flow rate is less than 35 sccm (ratio of $N_2$ to the total amount of Ar and $N_2$ [$N_2/(Ar+N_2)$] is less than 77%) so that nitridation is low, main bonding states in a film are Si—Si bonds, Si—N bonds, and Mo—Si bonds (see FIG. 5 and later-described FIG. 6). Since the Si—Si bonds are contained much, it is considered that influence on the irradiation durability occurs due to Si oxidation.

When the nitrogen flow rate is 35 sccm or more and 50 sccm or less ([$N_2/(Ar+N_2)$] is 77% or more and 83% or less), main bonding states in a film are Si—N bonds and Mo—Si bonds as shown in FIG. 6. Since there are almost no Si—Si bonds or Mo—N bonds, Si and Mo are hardly oxidized. Specifically, as shown in a diagram on the left side of FIG. 6, since the Mo—Si bonds are contained relatively more than the Mo—N bonds (see 1.50 min and 21.00 min), it is considered that, as compared with a case where the Mo—N bonds are contained relatively more than the Mo—Si bonds, the Mo—N bonds are relatively small in amount and thus influence due to Mo oxidation (i.e. decrease in irradiation durability) is smaller.

More specifically, in FIG. 6, peaks around a binding energy of 227.5 eV are relatively higher than peaks around a binding energy of 228 eV. Herein, "relatively higher" includes a case where when measurement is carried out at a plurality of points (e.g. 5 points) in the film thickness direction, the peaks are synthetically high.

In the case of a complete nitride film with a nitrogen flow rate of more than 50 sccm ([$N_2$/(Ar+$N_2$)] is more than 83%), main bonding states in the film are Si—N bonds and Mo—N bonds as shown in FIG. 7. Since the Mo—N bonds are contained, Mo is oxidized. Specifically, as shown in a diagram on the left side of FIG. 7, since the Mo—N bonds are contained relatively more than Mo—Si bonds (see 9.00 min and 33.00 min), it is considered that, as compared with a case where the Mo—Si bonds are contained relatively more than the Mo—N bonds, the Mo—N bonds are relatively large in amount and thus influence due to Mo oxidation (i.e. decrease in irradiation durability) is greater.

More specifically, in FIG. 7, peaks around a binding energy of 227.5 eV are relatively lower than peaks around a binding energy of 228 eV. Herein, "relatively lower" includes a case where when measurement is carried out at a plurality of points (e.g. 6 points) in the film thickness direction, the peaks are synthetically low.

In this invention, when the content ratio [M/(M+Si)] of the transition metal M to the transition metal M and silicon Si in the light-semitransmissive film is less than 9%, the above-mentioned operations and effects can be obtained. On the other hand, when the content ratio [M/(M+Si)] of the transition metal M increases, there is a case where the above-mentioned operations and effects (particularly the relationships shown in FIGS. 6 and 7) cannot be observed.

In this invention, it is more preferable that the content ratio [M/(M+Si)] of the transition metal M to the transition metal M and silicon Si in the light-semitransmissive film be less than 7% or less than 5% in terms of further reducing the Mo content and thus the Mo—N bonds in the film (in terms of further improving the irradiation durability).

In this invention, the film thickness change amount can be reduced to 4 nm or less when ArF excimer laser (wavelength 193 nm) with a pulse frequency of 300 Hz and a pulse energy of 16 mJ/cm²/pulse is continuously irradiated so that the cumulative dose becomes 30 kJ/cm².

In the DRAM half-pitch (hp) 32 nm generation according to the semiconductor device design rule, it is necessary to set CD variation to 2.6 nm or less on a wafer. For this purpose, CD variation required for a phase shift mask for use in the hp 32 nm generation is preferably suppressed to 5 nm or less. According to this invention, when a phase shift mask is manufactured, CD variation of a thin film pattern can be set to 5 nm or less.

In this invention, 20 at % or less oxygen may be contained in the light-semitransmissive film for controlling the transmittance.

In this invention, as the transition metal M, use can be made of molybdenum, tantalum, tungsten, titanium, chromium, hafnium, nickel, vanadium, zirconium, ruthenium, rhodium, or the like.

In this invention, it is preferable that the content ratio of the transition metal to the transition metal and the silicon in the light-semitransmissive film is 2% or more.

With this structure, the transmittance at a wavelength (e.g. 257 nm) of inspection light of a defect inspection apparatus can be set to 60% or less. Further, it is possible to reduce the thickness of the light-semitransmissive film.

In this invention, the content ratio [M/(M+Si)] of the transition metal M to the transition metal M and silicon Si in the light-semitransmissive film is more preferably 3% or more.

In this invention, it is preferable that the light-semitransmissive film has a transmittance of 4% or more and less than 9% with respect to a wavelength of the exposure light (structure 5).

If the transmittance is higher than 9%, it is difficult to obtain an incomplete nitridation state and thus to obtain the above-mentioned operations and effects. Specifically, if the transmittance is higher than 9%, a complete nitridation state is obtained even if the nitrogen gas flow rate is set close to zero (thus an incomplete nitridation state is not obtained). The transmittance is more preferably in a range of 8% or less. If the transmittance is less than 4%, the film thickness increases.

The transmittance herein represents a transmittance after the film formation without carrying out annealing or the like. Accordingly, if annealing is carried out for stress reduction or the like, it is necessary to carry out the film formation in expectation of a change in transmittance due to the annealing.

In this invention, it is preferable that the incomplete nitride film contains Mo—N bonds and Mo—Si bonds, and a content of the Mo—Si bonds is relatively greater than a content of the Mo—N bonds (structure 3).

This is because since, as shown in FIG. 6, the Mo—Si bonds are contained relatively more than the Mo—N bonds in the bonding states in the film, Si and Mo are hardly oxidized, resulting in enhanced irradiation durability, which is thus preferable.

In this invention, it is preferable that the incomplete nitride film mainly contains Si—N bonds and Mo—Si bonds (structure 4).

This is because since, as shown in FIG. 6, when the main bonding states in the film are the Si—N bonds and the Mo—Si bonds, there are almost no Si—Si bonds or Mo—N bonds, Si and Mo are hardly oxidized, resulting in enhanced irradiation durability, which is thus preferable.

The main bonding states in the film are associated with a portion excluding a surface layer portion where an oxide layer or the like is formed due to annealing or the like.

In this invention, it is preferable that a content of the nitrogen in the light-semitransmissive film is 40 at % or more and 47 at % or less (structure 6).

While the relationships with the Mo content in the film, the transmittance, and so on should also be taken into account, if the nitrogen content in the light-semitransmissive film exceeds 47 at %, it is difficult to obtain an incomplete nitridation state. If the nitrogen content in the light-semitransmissive film is less than 40 at %, Si—Si bonds tend to increase, resulting in degradation of the irradiation durability.

In this invention, it is preferable that the nitrogen content be less than the nitrogen content in a complete-nitride light-semitransmissive film by 2% or more and 20% or less. If the nitrogen content in the light-semitransmissive film is less than the nitrogen content in the complete-nitride light-semitransmissive film by less than 2%, it is difficult to obtain an incomplete nitridation state. On the other hand, if it is less than the nitrogen content in the complete-nitride light-semitransmissive film by more than 20%, Si—Si bonds tend to increase, resulting in degradation of the irradiation durability.

In this invention, it is preferable that the transition metal is molybdenum (structure 7).

This is because when the transition metal is molybdenum, the problem to be solved in this application becomes particularly significant.

In this invention, it is preferable that the light-semitransmissive film has a thickness of 75 nm or less (structure 8).

More preferably, the thickness of the light-semitransmissive film is 70 nm or less.

In this invention, the phase shift masks according to Structures 9 to 15 correspond to the phase shift mask blanks according to structures 1 to 8. Since the matters described above in Structures 1 to 8 are likewise applied to those phase shift masks, explanation thereof is omitted.

As described in structure 16, this invention provides a method of manufacturing a phase shift mask blank, the phase shift mask blank being used for manufacturing a phase shift mask adapted to be applied with ArF excimer laser exposure light, comprising:

a step of carrying out sputtering in an atmosphere containing a nitrogen gas to thereby form on a transparent substrate a light-semitransmissive film containing mainly a transition metal, silicon, and nitrogen, wherein a flow rate of the nitrogen gas in the atmosphere is less than a flow rate for completely nitriding the transition metal and the silicon.

According to this structure, it is possible to form a light-semitransmissive film which is composed mainly of a transition metal, silicon, and nitrogen and which is in an incomplete nitridation state.

In this invention, it is preferable that the flow rate of the nitrogen gas in the atmosphere is more than 70% and less than 95% with respect to the flow rate for completely nitriding the transition metal and the silicon.

According to this structure, it is possible to form, stably, reliably, and with high reproducibility, a light-semitransmissive film which is composed mainly of a transition metal, silicon, and nitrogen and which is in an incomplete nitridation state. This makes it possible to form the light-semitransmissive film whose film thickness change amount Δd before and after ArF excimer laser irradiation under later-described conditions is 4 nm or less and which is excellent in irradiation durability as compared with a light-semitransmissive film in a complete nitridation state.

In this invention, a sputtering film forming method, for example, is preferably cited as a method of forming the light-semitransmissive film, but this invention is not limited to the sputtering film forming method.

A DC magnetron sputtering apparatus is preferably cited as a sputtering apparatus, but this invention is not limited to this film forming apparatus. Another type of sputtering apparatus such as an RF magnetron sputtering apparatus may alternatively be used.

In this invention, the transparent substrate is not particularly limited as long as it has transparency at an exposure wavelength to be used. In this invention, a quartz substrate and various other glass substrates (e.g. soda-lime glass, aluminosilicate glass, etc.) can be used and, among them, the quartz substrate is particularly suitable for this invention because it has high transparency in the wavelength range of ArF excimer laser.

In this invention, the phase shift mask may be a halftone phase shift mask.

In this invention, the phase shift mask blank may be a mask blank for a halftone phase shift mask.

In this invention, in addition to the light-semitransmissive film and its pattern, it is possible to form another thin film and its pattern.

For example, in the case of a structure having a light-shielding film above or below the light-semitransmissive film, since the material of the light-semitransmissive film contains the transition metal silicide, a material of the light-shielding film can be formed of chromium having etching selectivity (having etching resistance) to the light-semitransmissive film or a chromium compound in which an element/elements such as oxygen, nitrogen, and carbon is/are added to chromium. This makes it possible to form a light-shielding film pattern above or below the light-semitransmissive film pattern.

In this invention, the material containing chromium may be chromium (Cr) alone or a material containing chromium (Cr) and one or more of elements such as nitrogen (N), oxygen (O), carbon (C), hydrogen (H), and helium (He). For example, it may be Cr, CrN, CrO, CrNO, CrNC, CrCON, or the like or a material containing, in addition thereto, hydrogen (H) or helium (He).

Effect of the Invention

According to this invention, if a light-semitransmissive film is an incomplete nitride film containing less than 9% transition metal (M), M-N bonds can be relatively reduced as compared with a case of a complete nitride film containing less than 9 at % transition metal (M), or the like. This makes it possible to prevent the transition metal from being oxidized and deposited on a surface layer of the light-semitransmissive film and, specifically, it is, surprisingly, possible to suppress a change in film thickness based on formation of a modified layer to zero, thereby significantly improving the irradiation durability.

EXAMPLES

Hereinbelow, this invention will be described in further detail with reference to Examples.

Example 1

Figures 7, 8:
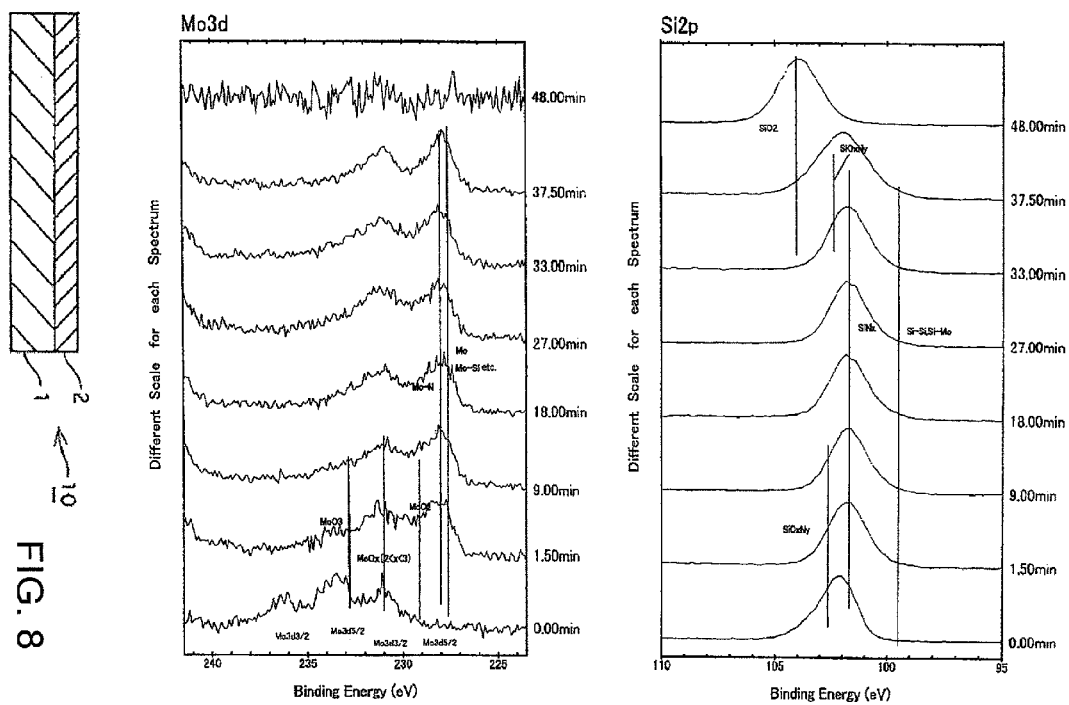
FIG. 7 is montage spectra (montage plots) showing the results of obtaining spectra at respective depths by XPS for a light-semitransmissive film formed in Comparative Example 2.
FIG. 8 is a cross-sectional view of a phase shift mask blank according to the Example.

As shown in FIG. 8, using a synthetic quartz glass substrate having a 6-inch square size with a thickness of 0.25 inches as a transparent substrate 1, a light-semitransmissive film 2 made of nitrided molybdenum and silicon was formed on the transparent substrate 1.

Specifically, using a mixed target of molybdenum (Mo) and silicon (Si) (Mo:Si=4 mol %:96 mol %), reactive sputtering (DC sputtering) was carried out by setting the power of a DC power supply to 3.0 kW in a mixed gas atmosphere of argon (Ar), nitrogen ($N_2$), and helium (He) (gas flow rates Ar:10.5 sccm, $N_2$:48 sccm, He:100 sccm) at a gas pressure of 0.3 Pa, thereby forming a MoSiN film made of molybdenum, silicon, and nitrogen and having a thickness of 67 nm.

This MoSiN film had a transmittance of 6.2% and a phase difference of 180.0 degrees at the wavelength (193 nm) of ArF excimer laser.

In the manner described above, a phase shift mask blank 10 was manufactured.

Figure 3:
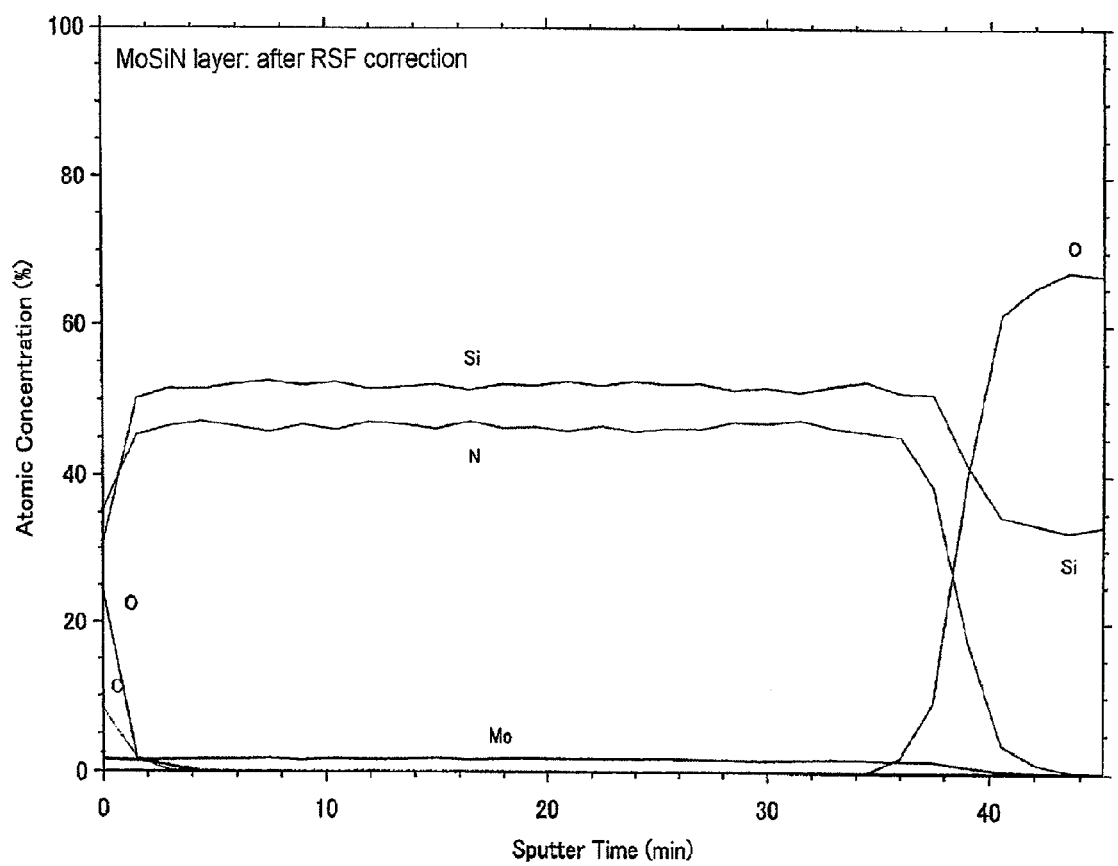
FIG. 3 is a depth profile showing the results of performing depth-direction analysis by XPS for a light-semitransmissive film formed in Example 1.

FIG. 3 shows the results of XPS (X-ray Photoelectron Spectroscopy) analysis of the MoSiN film. From FIG. 3, the composition of the MoSiN film was Mo:1.8 at %, Si:53.1 at %, and N:45.1 at %.

Then, ArF excimer laser irradiation durability was examined for the light-semitransmissive film (MoSiN film) formed in Example 1. Specifically, with respect to the light-semitransmissive film formed in Example 1, ArF excimer laser (wavelength 193 nm) with a pulse frequency of 300 Hz and a pulse energy of 16 mJ/cm$^2$/pulse was continuously irradiated so that the cumulative dose became 30 kJ/cm$^2$. Herein, the dose of 30 kJ/cm$^2$ corresponds to a dose which is received when a transfer pattern is exposed and transferred onto resist films of 112,500 wafers using a transfer mask. Then, a film thickness change amount Δd (nm) before and after the ArF irradiation was obtained by measurement. As a result, surprisingly, the film thickness change amount Δd was 0 nm and thus it was seen that extremely high ArF irradiation durability was obtained.

The light-semitransmissive film (MoSiN film) after the ArF irradiation had a transmittance of 6.7% and a phase difference of 174.9 degrees at the wavelength (193 nm) of ArF excimer laser and thus the changes were small before and after the ArF irradiation.

Comparative Example 1

Comparative Example 1 was the same as Example 1 except that the flow rate of nitrogen ($N_2$) was set to 0 sccm and the film thickness was set to 54 nm in Example 1.

Specifically, using a mixed target of molybdenum (Mo) and silicon (Si) (Mo:Si=4 mol %:96 mol %), sputtering (DC sputtering) was carried out by setting the power of a DC power supply to 3.0 kW in a mixed gas atmosphere of argon (Ar) and helium (He) (gas flow rates Ar:10.5 sccm, He:100 sccm) at a gas pressure of 0.3 Pa, thereby forming a MoSi film made of molybdenum and silicon and having a thickness of 54 nm on a transparent substrate.

This MoSi film had a transmittance of 0% at the wavelength (193 nm) of ArF excimer laser. It was not possible to measure the phase difference because the transmittance was too small.

Figure 2:
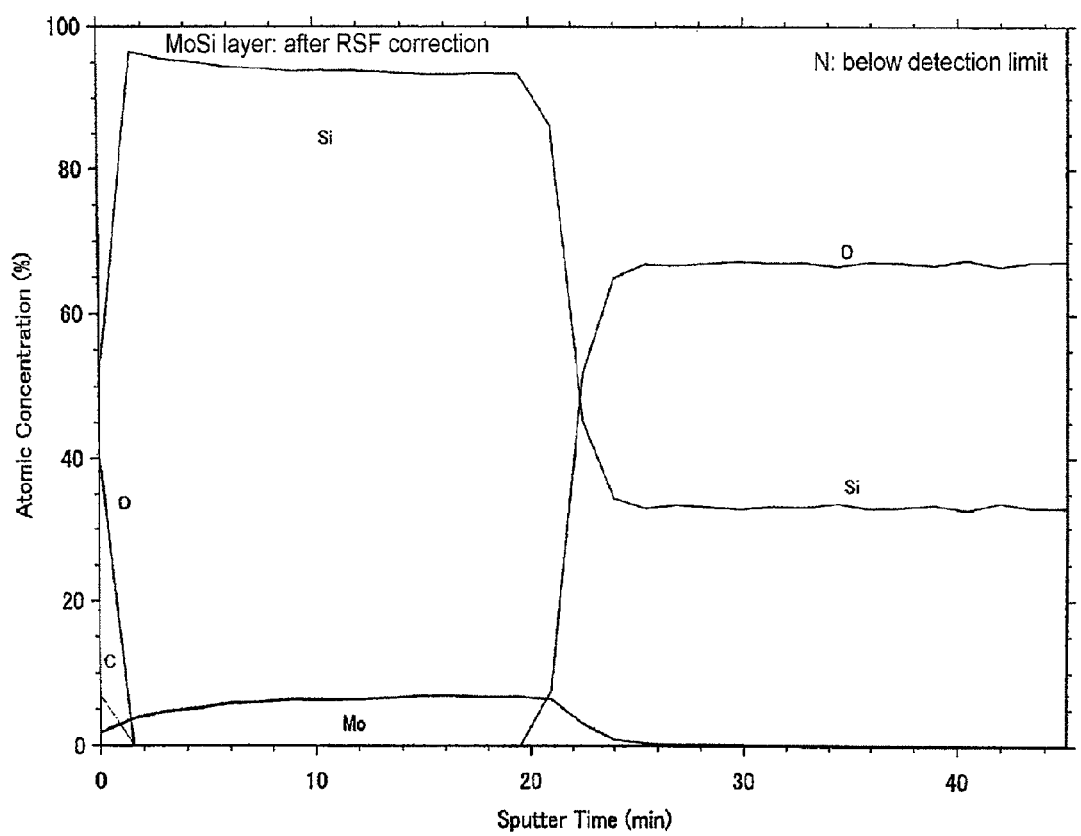
FIG. 2 is a depth profile showing the results of performing depth-direction analysis by XPS (X-ray Photoelectron Spectroscopy) for a light-semitransmissive film formed in Comparative Example 1.

FIG. 2 shows the results of XPS analysis of the MoSi film. From FIG. 2, the composition of the MoSi film was Mo:6.4 at % and Si:93.6 at %.

Then, in the same manner as in Example 1, ArF irradiation durability was examined for the light-semitransmissive film (MoSi film) formed in Comparative Example 1. As a result, a film thickness change amount Δd before and after the ArF irradiation was 11.3 nm and thus far exceeded a successful line of 4 nm.

Comparative Example 2

Comparative Example 2 was the same as Example 1 except that the flow rate of nitrogen ($N_2$) was set to 55 sccm in Example 1.

Specifically, using a mixed target of molybdenum (Mo) and silicon (Si) (Mo:Si=4 mol %:96 mol %), reactive sputtering (DC sputtering) was carried out by setting the power of a DC power supply to 3.0 kW in a mixed gas atmosphere of argon (Ar), nitrogen ($N_2$), and helium (He) (gas flow rates Ar:10.5 sccm, $N_2$:55 sccm, He:100 sccm) at a gas pressure of 0.3 Pa, thereby forming a MoSiN film made of molybdenum, silicon, and nitrogen and having a thickness of 67 nm on a transparent substrate.

This MoSiN film had a transmittance of 9.6% and a phase difference of 178.2 degrees at the wavelength (193 nm) of ArF excimer laser.

Figure 4:
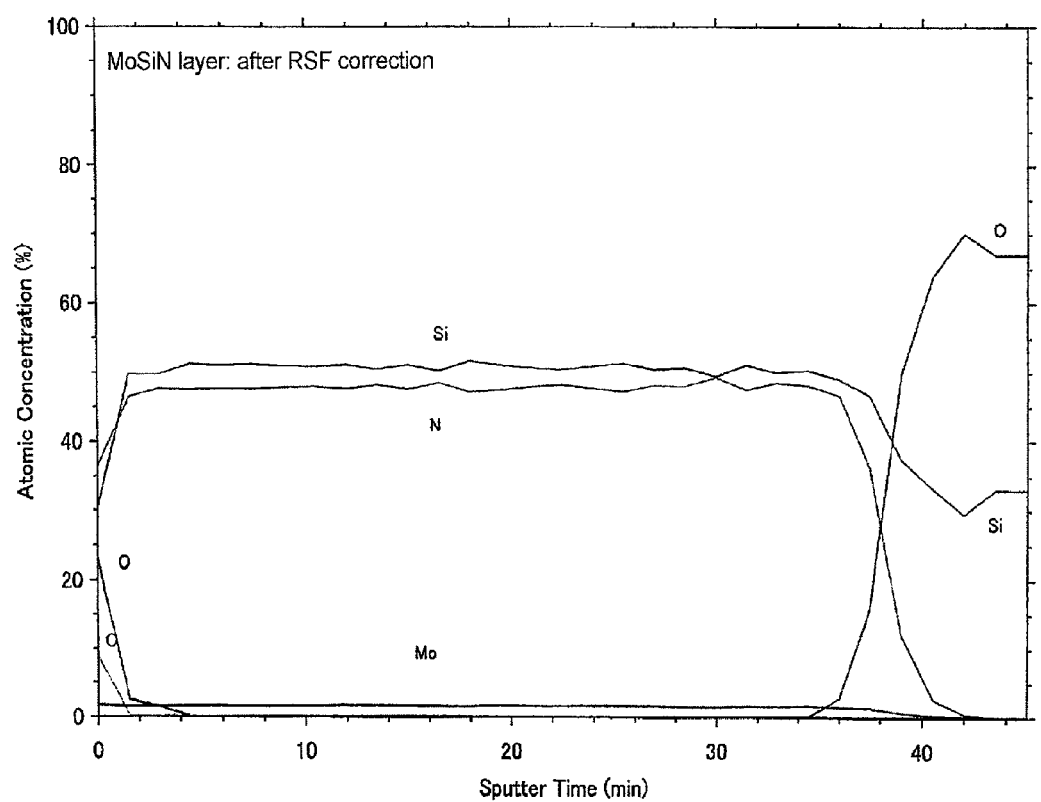
FIG. 4 is a depth profile showing the results of performing depth-direction analysis by XPS for a light-semitransmissive film formed in Comparative Example 2.
Figure 5:
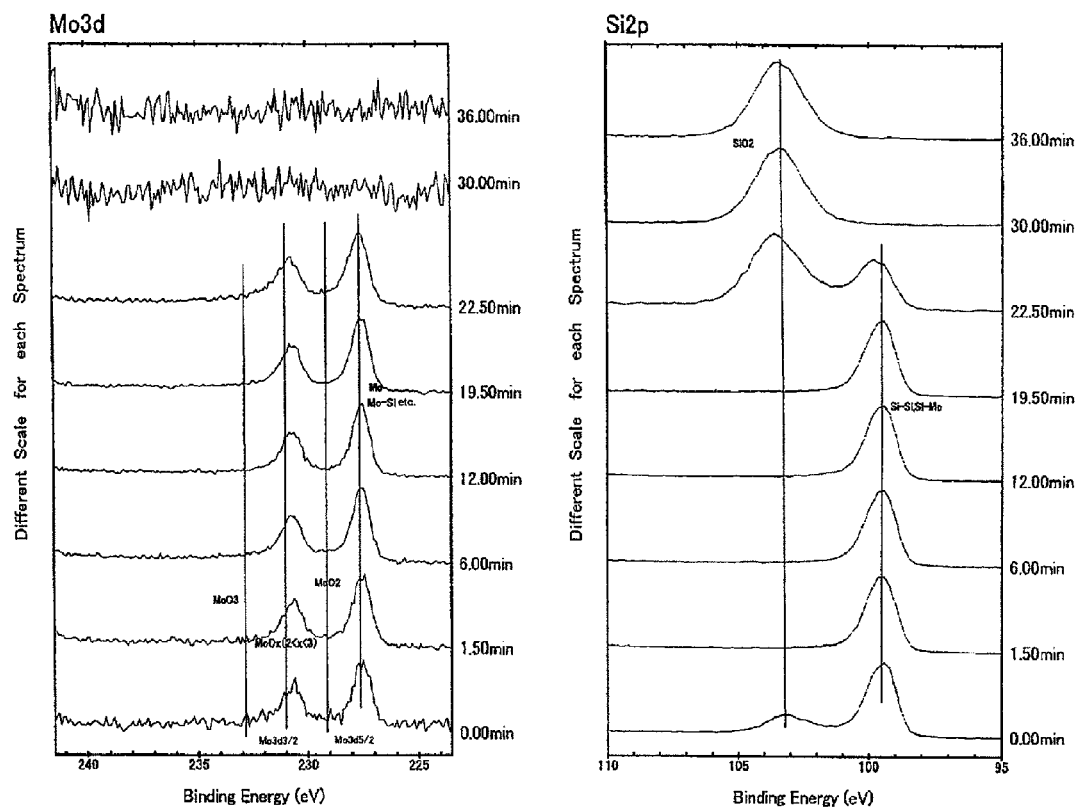
FIG. 5 is montage spectra (montage plots) showing the results of obtaining spectra at respective depths by XPS for a light-semitransmissive film formed in Comparative Example 1.

FIG. 4 shows the results of XPS analysis of the MoSiN film. From FIG. 4, the composition of the MoSiN film was Mo:1.3 art %, Si:50.2 at %, and N:48.5 at %.

Then, in the same manner as in Example 1, ArF irradiation durability was examined for the light-semitransmissive film formed in Comparative Example 2. As a result, a film thickness change amount Δd before and after the ArF irradiation was 4.7 nm and thus exceeded the successful line of 4 nm.

The light-semitransmissive film (MoSiN film) after the ArF irradiation had a transmittance of 11.0% and a phase difference of 169.4 degrees at the wavelength (193 nm) of ArF excimer laser and thus the changes were considerable before and after the ArF irradiation.

In a comparison between Example 1 and Comparative Example 2, the compositions of the MoSiN films are close to each other and thus the difference is small. However, surprisingly, the film thickness change amounts Δd before and after the ArF irradiation and the transmittance and phase difference change amounts before and after the ArF irradiation largely differ from each other. This is considered to be due to a difference between the MoSiN films being a complete nitride film and an incomplete nitride film.

Specifically, it is considered as follows.

In each of Example 1 and Comparative Example 2, basically, the contents of Si and N are close to each other and therefore the occupation ratio of Si—N bonds is considered to be high in main bonding states in the film. Further, in a comparison between Example 1 and Comparative Example 2, in each of Example 1 and Comparative Example 2, basically, the content of Mo is low and therefore the contents of Mo—Si bonds and Mo—N bonds are also low.

Figure 6:
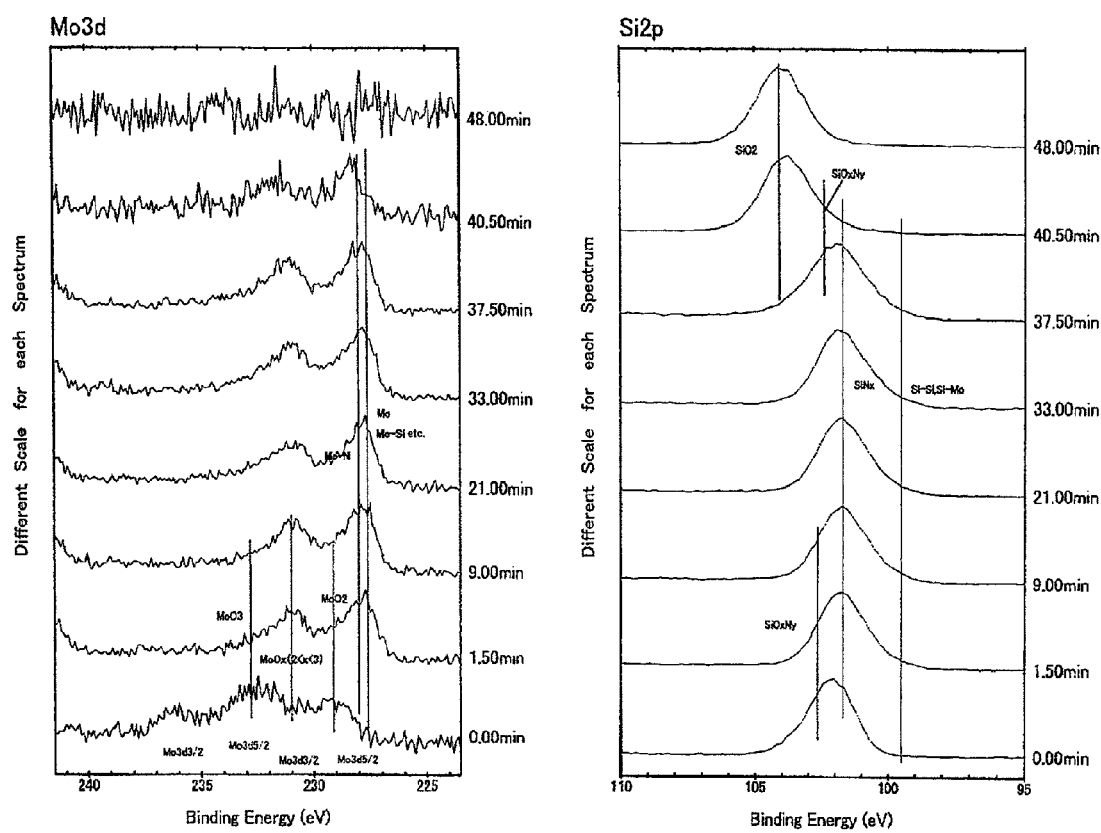
FIG. 6 is montage spectra (montage plots) showing the results of obtaining spectra at respective depths by XPS for a light-semitransmissive film formed in Example 1.

In the basic state described above, when change occurs from a complete nitride film state shown in FIG. 7 to an incomplete nitride film state shown in FIG. 6, change occurs from a state where, as shown in a diagram on the left side of FIG. 7, Mo—N bonds are contained relatively more than Mo—Si bonds (see 9.00 min and 33.00 min), to a state where, as shown in a diagram on the left side of FIG. 6, Mo—Si bonds are contained relatively more than Mo—N bonds (see 1.50 min and 21.00 min). It is considered that this and the content of Mo being basically low as described above conjointly cause a large difference in ArF irradiation durability. For example, it is considered that since, as compared with the case, shown in the diagram on the left side of FIG. 7, where the Mo—N bonds are contained relatively more than the Mo—Si bonds, the Mo—Si bonds are relatively large in amount while the Mo—N bonds are relatively small in amount in the diagram on the left side of FIG. 6, influence due to MoN oxidation (i.e. decrease in irradiation durability) becomes smaller.

In the basic state described above, when change occurs from a complete nitride film state shown in FIG. 4 to an incomplete nitride film state shown in FIG. 3, the nitrogen content in the film decreases by about 3 at % while the Si content in the film increases by about 3 at %. Following this, the ratio of the nitrogen content in the film to the Si content in the film (nitrogen content in the film/Si content in the film) decreases from about 97% to about 85%. It is considered that this and the occurrence of a difference in, for example, state of bonding (e.g. strength of bonding) or film quality due to that cause a large difference in ArF irradiation durability.

Figure 1:
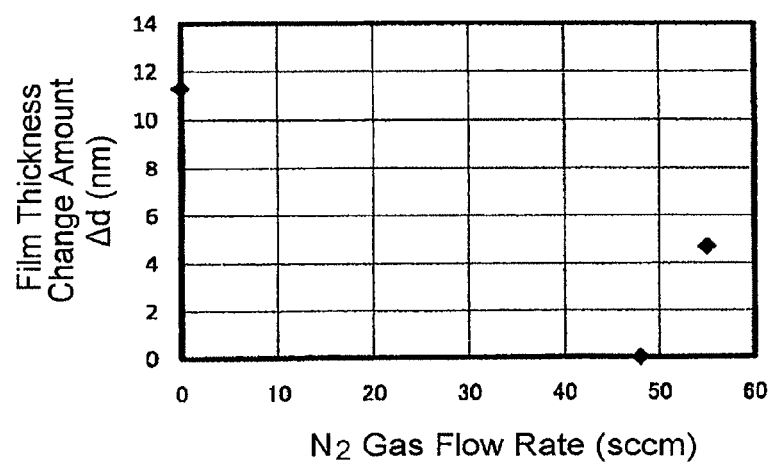
FIG. 1 is a diagram showing the results of examining the relationship between the $N_2$ gas flow rate (sccm) and the film thickness change amount Δd (nm) before and after ArF excimer laser irradiation for light-semitransmissive films formed in Example 1, Comparative Example 1, and Comparative Example 2.

FIG. 1 is a diagram showing the results of examining the relationship between the $N_2$ gas flow rate (sccm) and the film thickness change amount Δd (nm) before and after the ArF irradiation for the light-semitransmissive films formed in Example 1, Comparative Example 1, and Comparative Example 2.

From FIG. 1, it is seen that when carrying out sputtering in an atmosphere containing nitrogen, if the flow rate of nitrogen in the atmosphere is set less than a flow rate high enough to completely nitride a transition metal and silicon, it is possible to obtain an incomplete nitride film and that, as a result, the film thickness change amount Δd before and after the ArF irradiation is 0 nm and thus extremely high ArF irradiation durability is obtained as compared with the case of a complete nitride film.

Example 2

In Example 1, the target ratio between molybdenum and silicon and the gas flow rates were changed and the film thickness was set to 67 nm.

Specifically, using a mixed target of molybdenum (Mo) and silicon (Si) (Mo:Si=6 mol %:94 mol %), reactive sputtering (DC sputtering) was carried out by setting the power of a DC power supply to 3.0 kW in a mixed gas atmosphere of argon (Ar), nitrogen ($N_2$), and helium (He) (gas flow rates Ar:12.5 sccm, $N_2$:50 sccm, He:100 sccm) at a gas pressure of 0.3 Pa, thereby forming a MoSiN film made of molybdenum, silicon, and nitrogen and having a thickness of 67 nm.

This MoSiN film had a transmittance of 4.8% and a phase difference of 173.9 degrees at the wavelength (193 nm) of ArF excimer laser.

Then, the substrate was heat-treated (annealed) in the atmosphere at 500° C. for 30 minutes. This MoSiN film had a transmittance of 6.1% and a phase difference of 177.3 degrees at the wavelength (193 nm) of ArF excimer laser.

Then, in the same manner as in Example 1, ArF irradiation durability was examined for the light-semitransmissive film (MoSiN film) formed in Example 2. As a result, a film thickness change amount Δd before and after the ArF irradiation was 2 nm and thus it was seen that extremely high ArF irradiation durability was obtained.

The light-semitransmissive film (MoSiN film) after the ArF irradiation had a transmittance of 6.8% and a phase difference of 172.1 degrees at the wavelength (193 nm) of ArF excimer laser and thus the changes were small before and after the ArF irradiation.

Comparative Example 3

In Example 1, the target ratio between molybdenum and silicon and the gas flow rates were changed and the film thickness was set to 69 nm.

Specifically, using a mixed target of molybdenum (Mo) and silicon (Si) (Mo:Si=10 mol %:90 mol %), reactive sputtering (DC sputtering) was carried out by setting the power of a DC power supply to 3.0 kW in a mixed gas atmosphere of argon (Ar), nitrogen ($N_2$), and helium (He) (gas flow rates Ar:8 sccm, $N_2$:72 sccm, He:100 sccm) at a gas pressure of 0.3 Pa, thereby forming a MoSiN film made of molybdenum, silicon, and nitrogen and having a thickness of 69 nm.

This MoSiN film had a transmittance of 4.9% and a phase difference of 177.6 degrees at the wavelength (193 nm) of ArF excimer laser.

Then, the substrate was heat-treated (annealed) in the atmosphere at 280° C. for 10 minutes. This MoSiN film had a transmittance of 6.1% and a phase difference of 179.2 degrees at the wavelength (193 nm) of ArF excimer laser.

Then, in the same manner as in Example 1, ArF irradiation durability was examined for the light-semitransmissive film (MoSiN film) formed in Comparative Example 3. As a result, a film thickness change amount Δd before and after the ArF irradiation was 10 nm and thus far exceeded the successful line of 4 nm.

The light-semitransmissive film (MoSiN film) after the ArF irradiation had a transmittance of 7.0% and a phase difference of 170.4 degrees at the wavelength (193 nm) of ArF excimer laser and thus the changes were considerable before and after the ArF irradiation.

Example 3

Figure 9:
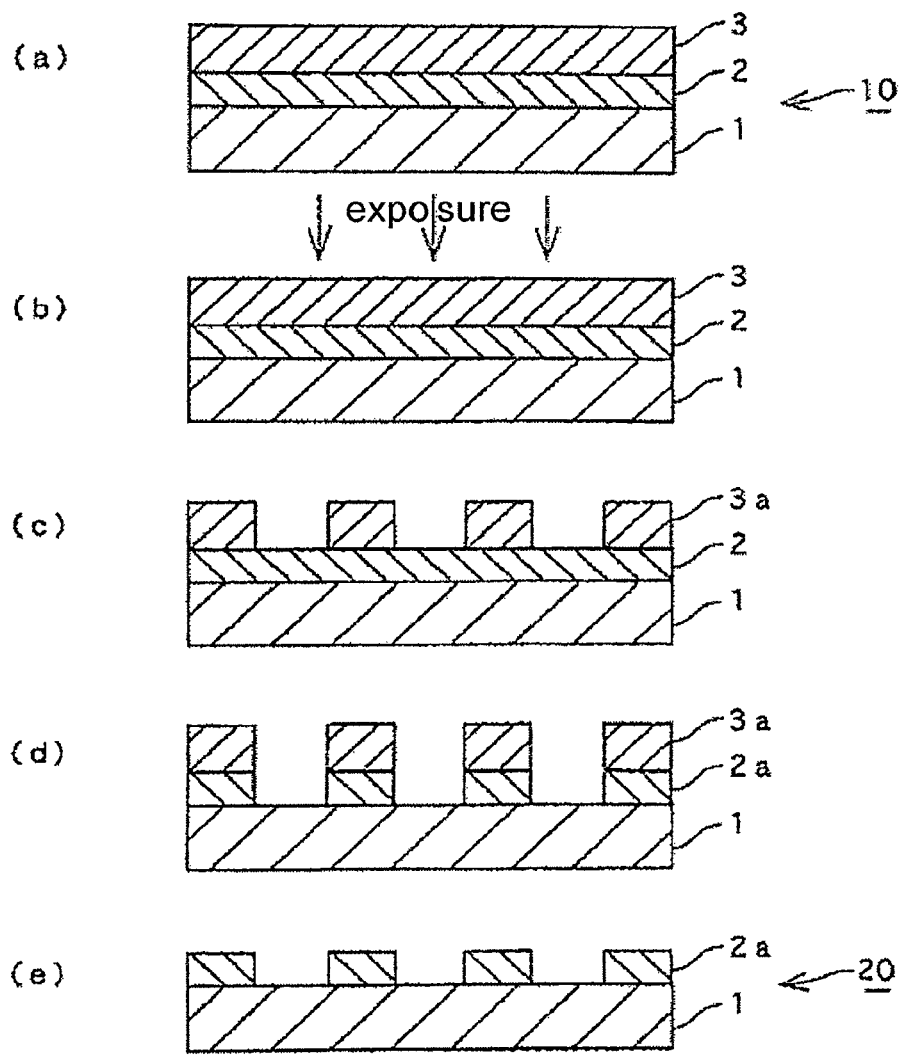
FIG. 9 is cross-sectional views showing processes of manufacturing a phase shift mask using the phase shift mask blank according to the Example.

A halftone phase shift mask was manufactured using the same phase shift mask blank as in Example 1 described above. FIG. 9 is cross-sectional views showing processes of manufacturing the phase shift mask using the phase shift mask blank. First, a chemically amplified positive resist film for electron beam writing (PRL009 manufactured by FUJI-FILM Electronic Materials Co., Ltd.) was formed as a resist film 3 on a mask blank 10 (see the same figure, (a)). The resist film 3 was formed by spin coating using a spinner (spin coating apparatus).

Then, using an electron beam writing apparatus, a required pattern was written on the resist film 3 formed on the mask blank 10 and, thereafter, the resist film 3 was developed with a predetermined developer, thereby forming a resist pattern 3a (see the same figure, (b) and (c)).

Then, using the resist pattern 3a as a mask, a light-semitransmissive film 2 (MoSiN film) was etched, thereby forming a light-semitransmissive film pattern 2a (see the same figure, (d)). A mixed gas of $SF_6$ and He was used as a dry etching gas.

Then, the remaining resist pattern was stripped, thereby obtaining a phase shift mask 20 (see the same figure, (e)). There was almost no change in composition, transmittance, and phase difference of the light-semitransmissive film as compared with those at the time of the manufacture of the mask blank.

In the same manner as in Example 1, ArF excimer laser irradiation durability was examined for the light-semitransmissive film (MoSiN film) pattern of the manufactured phase shift mask. As a result, a film thickness change amount Δd was 0 nm and thus it was seen that extremely high ArF excimer laser irradiation durability was obtained.

With respect to the light-semitransmissive film (MoSiN film) after the ArF irradiation, changes in transmittance and phase difference at the wavelength (193 nm) of ArF excimer laser were small before and after the ArF irradiation as in Example 1.

Example 4

A Cr-based light-shielding film was formed on a light-semitransmissive film formed in the same manner as in Example 1. Then, the Cr-based light-shielding film and the light-semitransmissive film were respectively patterned, thereby manufacturing a halftone phase shift mask having a light-shielding band. This halftone phase shift mask was irradiated with ArF excimer laser (wavelength 193 nm) under the same conditions as in Example 1. Using this prepared halftone phase shift mask, a process was carried out to expose and transfer a transfer pattern onto a resist film on a semiconductor wafer as a transfer target. An exposure apparatus used was of the immersion type with annular illumination (Annular Illumination) using an ArF excimer laser as a light source. Specifically, by setting the halftone phase shift mask on a mask stage of the exposure apparatus, a transfer pattern was exposed and transferred onto a resist film for ArF immersion exposure on a semiconductor wafer. Then, the exposed resist film was subjected to predetermined development, thereby forming a resist pattern.

Further, using the resist pattern, a circuit pattern including a DRAM half-pitch (hp) 32 nm line & space (L&S) pattern was formed on the semiconductor wafer.

The obtained circuit pattern on the semiconductor wafer was observed by an electron microscope (TEM). As a result, the specification of the DRAM half-pitch (hp) 32 nm L&S pattern was fully satisfied. That is, it was confirmed that this halftone phase shift mask was fully able to transfer a circuit pattern including a DRAM half-pitch (hp) 32 nm L&S pattern onto a semiconductor wafer.

The invention claimed is:

1. A phase shift mask blank for manufacturing a phase shift mask adapted to be applied with ArF excimer laser exposure light, comprising:
    a transparent substrate; and
    a light-semitransmissive film on the transparent substrate;
    wherein the light-semitransmissive film is an incomplete nitride film containing mainly a transition metal (M), silicon (Si), and nitrogen (N),
    a content ratio of the transition metal to the transition metal and the silicon in the light-semitransmissive film is less than 5%, and
    a content of the nitrogen in the light-semitransmissive film is 40 at % or more and 47 at % or less.

2. The phase shift mask blank according to claim 1, wherein the content ratio of the transition metal to the transition metal and the silicon in the light-semitransmissive film is 2% or more.

3. The phase shift mask blank according to claim 1, wherein the incomplete nitride film mainly contains Si—N bonds and M-Si bonds.

4. The phase shift mask blank according to claim 1, wherein the light-semitransmissive film has a transmittance of 4% or more and less than 9% with respect to a wavelength of the exposure light.

5. The phase shift mask blank according to claim 1, wherein the transition metal is molybdenum.

6. The phase shift mask blank according to claim 1, wherein the light-semitransmissive film has a thickness of 75 nm or less.

7. The phase shift mask blank according to claim 1, further comprising:
    a light-shielding film formed on the light-semitransmissive film.

8. The phase shift mask blank according to claim 1, further comprising:
    a resist film formed on the phase shift mask blank.

9. A method of manufacturing a semiconductor device, comprising:
    forming a circuit pattern on a semiconductor wafer using a transfer mask manufactured by using the phase shift mask blank according to claim 1.

10. A phase shift mask adapted to be applied with ArF excimer laser exposure light, comprising:
    a transparent substrate; and
    a light-semitransmissive film pattern on the transparent substrate;
    wherein the light-semitransmissive film pattern is made of an incomplete nitride film containing mainly a transition metal (M), silicon (Si), and nitrogen (N),
    a content ratio of the transition metal to the transition metal and the silicon in the light-semitransmissive film pattern is less than 5%, and
    a content of the nitrogen in the light-semitransmissive film pattern is 40 at % or more and 47 at % or less.

11. The phase shift mask according to claim 10, wherein the content ratio of the transition metal to the transition metal and the silicon in the light-semitransmissive film pattern is 2% or more.

12. The phase shift mask according to claim 10, wherein the incomplete nitride film mainly contains Si—N bonds and M-Si bonds.

13. The phase shift mask according to claim 10, wherein the transition metal is molybdenum.

14. The phase shift mask according to claim 10, wherein the light-semitransmissive film pattern has a thickness of 75 nm or less.

15. The phase shift mask according to claim 10, further comprising:
    a light-shielding film pattern formed on the light-semitransmissive film pattern.

16. A method of manufacturing a semiconductor device, comprising:
    forming a circuit pattern on a semiconductor wafer using the phase shift mask according to claim 10.

17. A method of manufacturing a phase shift mask blank, the phase shift mask blank being used for manufacturing a phase shift mask adapted to be applied with ArF excimer laser exposure light, the phase shift mask blank comprising a transparent substrate and a light-semitransmissive film on the transparent substrate, the light-semitransmissive film being an incomplete nitride film containing mainly a transition metal (M), silicon (Si), and nitrogen (N), the method comprising:

a step of carrying out sputtering in an atmosphere containing a nitrogen gas to thereby form on the transparent substrate the light-semitransmissive film containing mainly a transition metal, silicon, and nitrogen, wherein a flow rate of the nitrogen gas in the atmosphere is less than a flow rate for completely nitriding the transition metal and the silicon, the flow rate of the nitrogen gas in the atmosphere is a flow rate for forming the incomplete nitride film in which a content ratio of the transition metal to the transition metal and the silicon in the light-semitransmissive film is less than 5%, and the flow rate of the nitrogen gas in the atmosphere is more than 70% and less than 95% with respect to the flow rate for completely nitriding the transition metal and the silicon.

* * * * *